United States Patent
Steinmeyer et al.

(10) Patent No.: US 8,582,256 B2
(45) Date of Patent: Nov. 12, 2013

(54) SUPERCONDUCTING RESISTIVE FAULT CURRENT LIMITER

(75) Inventors: Florian Steinmeyer, Herzogenaurach (DE); Simon Krämer, Brühl (DE)

(73) Assignee: NEXANS, Paris (FR)

( * ) Notice: Subject to any disclaimer, the term of this patent is extended or adjusted under 35 U.S.C. 154(b) by 0 days.

(21) Appl. No.: 13/330,998

(22) Filed: Dec. 20, 2011

(65) Prior Publication Data

US 2012/0170158 A1 Jul. 5, 2012

(30) Foreign Application Priority Data

Jan. 3, 2011 (EP) ..................................... 11305005

(51) Int. Cl.
*H02H 7/00* (2006.01)
(52) U.S. Cl.
USPC ........................................... 361/19; 391/93.1
(58) Field of Classification Search
None
See application file for complete search history.

(56) References Cited

U.S. PATENT DOCUMENTS

| | | |
|---|---|---|
| 6,522,236 B1 | 2/2003 | Ries |
| 7,180,396 B2 | 2/2007 | Bock et al. |
| 7,586,396 B2 | 9/2009 | Bock et al. |
| 7,706,110 B2 * | 4/2010 | Bock et al. ..................... 361/19 |
| 7,710,692 B2 | 5/2010 | Elschner et al. |
| 2008/0070788 A1 | 3/2008 | Kramer et al. |
| 2008/0194411 A1 * | 8/2008 | Folts et al. .................... 505/110 |
| 2009/0190274 A1 * | 7/2009 | Ko et al. ......................... 361/19 |
| 2012/0002336 A1 * | 1/2012 | Usoskin et al. .............. 361/93.9 |

FOREIGN PATENT DOCUMENTS

WO 2009010715 1/2009

OTHER PUBLICATIONS

International Search Report dated May 24, 2011.

* cited by examiner

*Primary Examiner* — Jared Fureman
*Assistant Examiner* — Terrence Willoughby
(74) *Attorney, Agent, or Firm* — Sofer & Haroun, LLP

(57) ABSTRACT

A high-temperature superconductor fault current limiter elements (1) of standardized modular design and a high-temperature superconductor fault current limiter unit to protect an electrical application such as power network from damage in case of fault event.

15 Claims, 8 Drawing Sheets

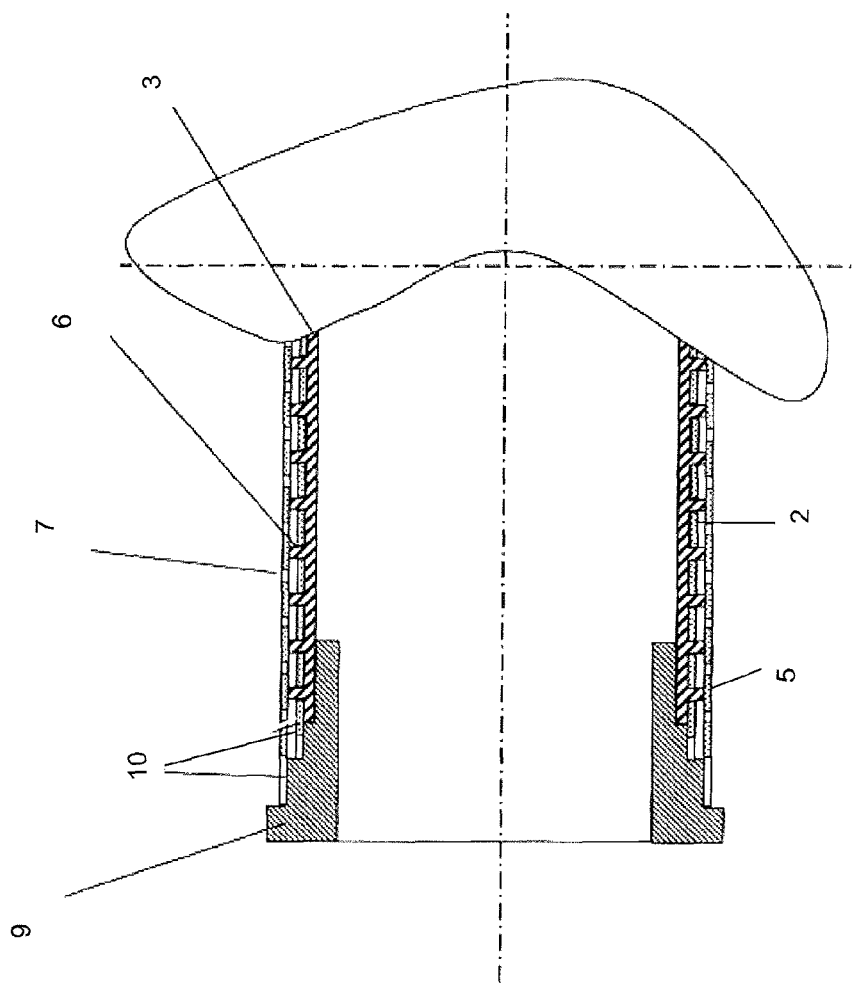
Fig. 3 cut A-A'

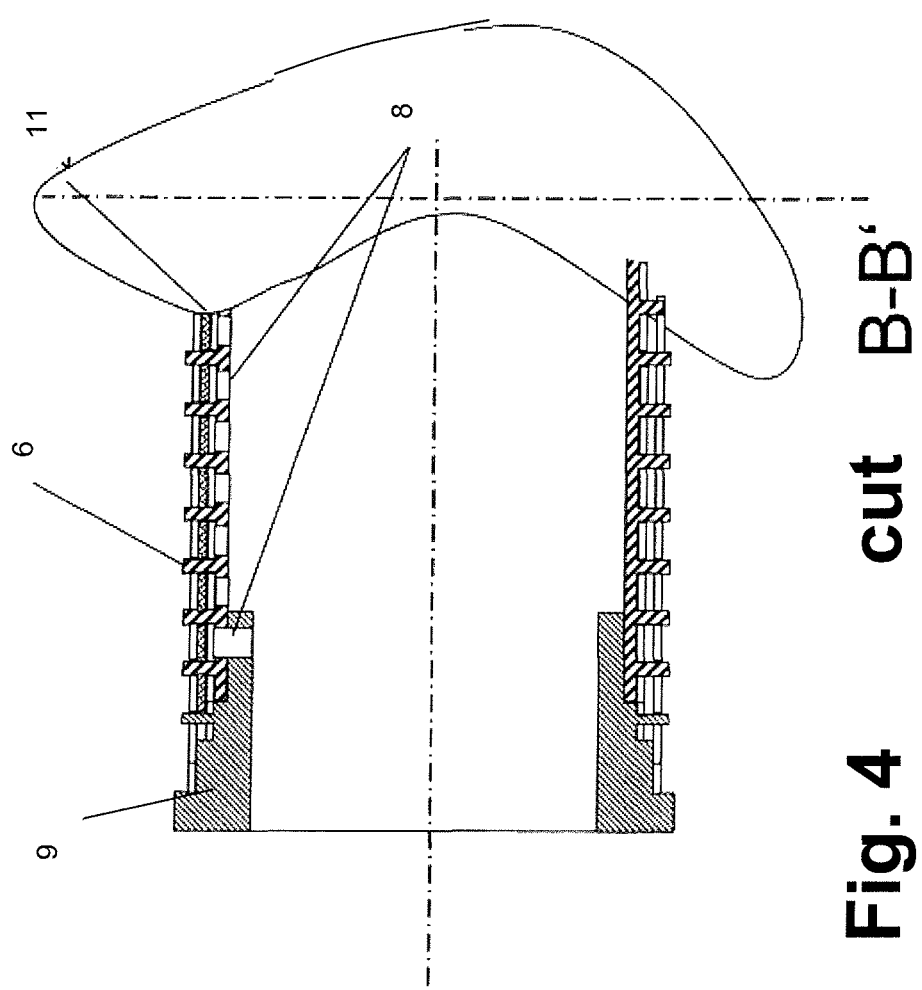

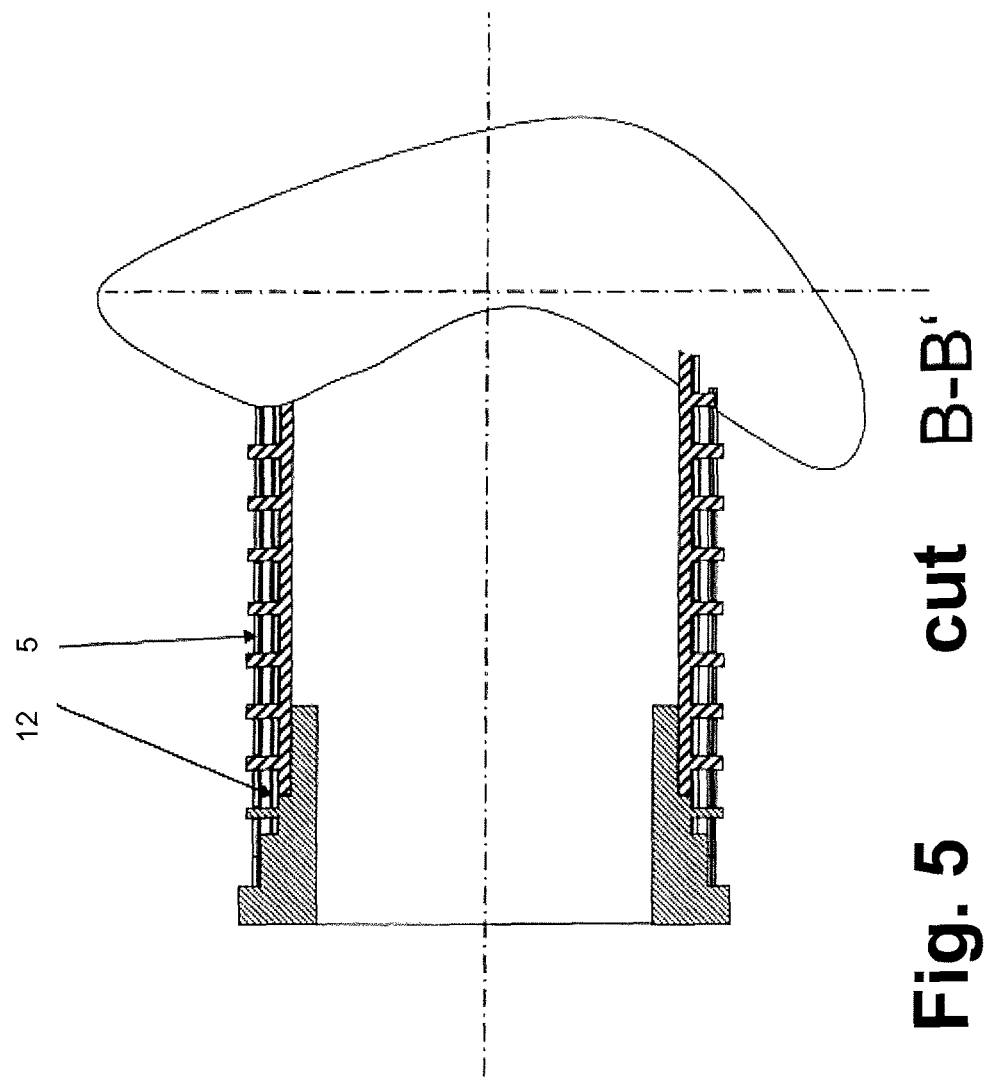

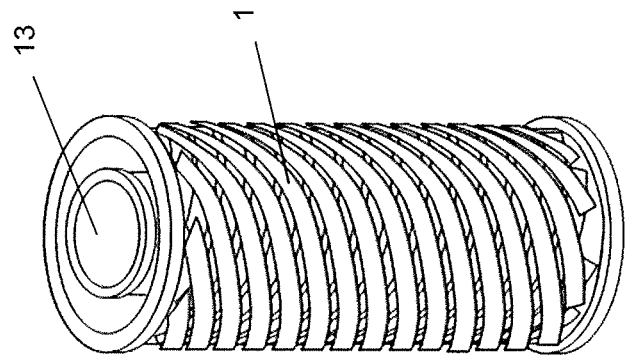
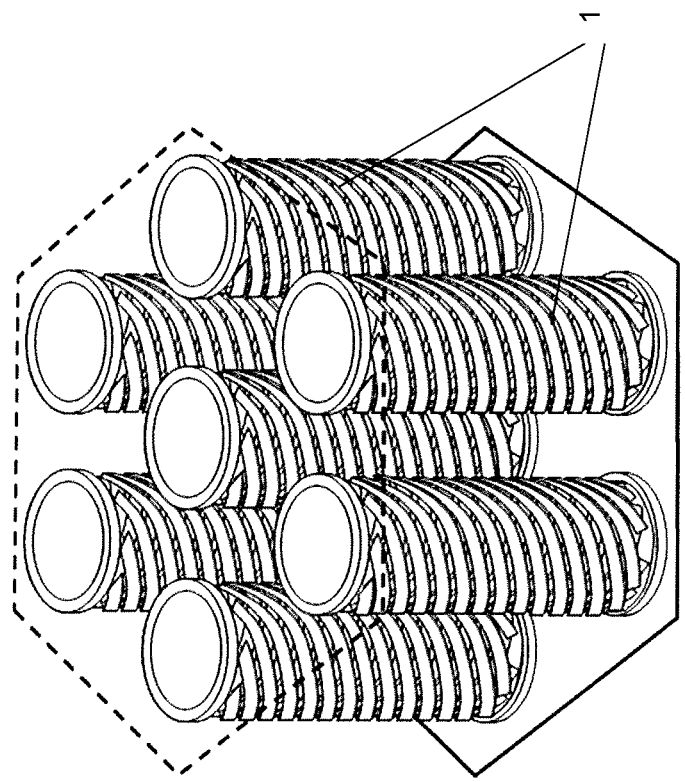
Fig. 6b
Fig. 6a

SUPERCONDUCTING RESISTIVE FAULT CURRENT LIMITER

RELATED APPLICATION

This application claims the benefit of priority from European Patent Application No. 11 305 005.8, filed on Jan. 3, 2011, the entirety of which is incorporated by reference.

BACKGROUND

1. Field of the Invention

The present invention relates to a superconducting resistive current limiter, particularly to a high-temperature superconducting resistive current limiter.

2. Description of the Related Art

Superconducting fault current limiters are devices that automatically limit fault current in high voltage networks to a low current value close to the nominal current. The benefit of such a device is that it reduces drastically the short circuit power of the high voltage network and, thus, allows to interconnect networks without increasing the short circuit power or to decrease safety margins so that other machineries connected to the network can be designed for lower short circuit power and, therefore, can be made lighter and cheaper.

Superconductors, in particular, high-temperature superconductors, offer a great potential as resistive fault current limiters which enable rapid and effective current limitation, automatic recovery, negligible impedance during normal operation and application at high voltage.

Current limiters based on high-temperature superconducting materials make use of the property of superconducting materials to switch from there superconducting state with essentially no resistance to a normal conductive and normal resistive state when at least one of its critical temperature (Tc), critical magnetic field (Hc) or critical current (Ic) is exceeded.

For example, in case of fault the current flowing through the superconductor material exceeds the critical current of the superconductor material due to large surge current and the superconductor material undergoes transition from the superconducting state to the normal conducting state. This transition is also termed "quenching".

Typically, a superconducting fault current limiter comprises one or more superconducting limiter elements housed in an insulation housing such as a cryostat filled with a cooling medium for cooling the superconducting limiter elements below their critical temperature Tc at which they exhibit superconducting properties.

The critical temperature depends on the specific superconductor material. Suitable cooling mediums are for example nitrogen, helium, neon, hydrogen or mixtures thereof in their liquid state.

High-temperature superconductors within the meaning of the present invention are those having a critical temperature of 30 K or more, preferably of 77 K or more. Preferred are high-temperature superconductors with a critical temperature of 77 K or more since for cooling liquid nitrogen can be used which is easy to handle and cheap.

High-temperature superconductors with a critical temperature of 77 K or more are, for example, those known as high-temperature superconducting ceramic oxides.

Preferably, the high-temperature superconductor ceramic oxide is selected from the group consisting of bismuth-based, thallium-based, rare earth metal based, and mercury-based superconductor ceramic oxides.

Typical examples thereof comprise ceramic oxide superconductors based on Bi-Ae—Cu—O, (Bi, Pb)-Ae—Cu—$O_y$, Re-Ae—Cu—$O_y$, Tl-Ae—Cu—$O_y$, or Hg-Ae—Cu—$O_y$, wherein y represents the relative oxygen content in the range appropriate for the particular superconductor material to have superconducting property.

In the above formula Ae means at least one alkaline earth element, particularly, Ba, Ca and/or Sr.

Re means at least one rare earth element, particularly Y or a combination of two or more of the elements Y, La, Lu, Sc, Sm, Nd or Yb.

There are known fault current limiters comprising bulk limiter elements made of high-temperature superconductor material in form of tubes, rods, cylindrical coils etc. Such bulk limiter elements can be obtained by, for example, melt-casting process as disclosed in EP 1 876 683 A1, EP 1 524 748 B1 and EP 1 622 210 B1.

Apart from high-temperature superconductor bulk limiter elements there are known applications using thin films made of high-temperature superconductor material.

Thin films made of high-temperature superconductor materials are used in a form referred to "coated conductor".

Generally, coated conductors are tape-like conductors of long length having a multilayer composition with a substrate, a superconductor layer and a varying number of buffer layers between the substrate and the superconductor layer. The buffer layer(s) serve to compensate for the various different properties of the materials used.

A high-temperature superconducting resistive fault current limiter making use of a coated conductor is disclosed in US 2008/0070788 A1. In the design disclosed a coated conductor tape is used which is wound to a flat, disc-shaped bifilar coil, with a distance through which a cooling medium can flow, being maintained between adjacent coil turns. Further, a spacer is provided running in parallel to the coil turns within the space between adjacent coil turns.

In order to be suitable in the production of a fault current limiter a high-temperature superconductor fault current limiter element should meet several requirements.

A basic problem is the way of winding of large length of a coated conductor in order to obtain a functioning high-temperature superconductor fault current limiter element. In doing so a number of requirements must be met which are partially conflicting:

The winding should be space saving and compact. However, the bending radii must not be too small for avoiding mechanical damage of the coated conductor.

The coated conductor should be in direct contact with the cooling medium to allow rapid recovery to the operational state by means of cooling after fault event. This is important since a current limiter should be ready for operation after fault event as soon as possible for accepting nominal power and being ready for the next short circuit event.

The configuration of winding of the coated conductor should have an inductivity as low as possible. Since the fields induced by inductivity cause strong Lorentz forces and decrease the current carrying capacity, in order to compensate these disadvantages the design of the fault current limiter becomes more complicated.

Further, a standardized modular design is desirable for allowing easy adaptation of the fault current limiter to the specific requirements of an electrical application in view of nominal voltage and/or nominal current.

Considering that fault current limiters are operated at high voltage to very high voltage such as 10 kV to more than 100 kV a high breakthrough strength is mandatory which allows the fault current limiter to withstand high overloadings.

Nitrogen, which conventionally is used as the cooling medium, has a high breakthrough strength in its liquid state which, however, decreases significantly in the gaseous state. Thus, on heating, in particular during quench, when the liquid nitrogen is evaporated and gas bubbles are generated, the breakthrough strength is significantly lowered. Consequently, the design of the fault current limiter must be such, that partial discharge and flashover are suppressed even when the breakthrough strength of the cooling medium is decreased, for example due to formation of gas bubbles.

Though the design of the bifilar coil disclosed in EP 1 042 820 B1 referred to above essentially meets the requirements of space saving, cooling, low inductivity and standardization there is improvement required with respect to breakthrough strength.

In the bifilar coil design the end (entry) with the lowest voltage level and the end (exit) with the highest voltage level are located next to each other which results in a design of low breakthrough strength and enhanced risk of flashover as illustrated below.

Considering a bifilar coil design according to EP 1 042 820 B1 with a coated conductor length of 50 m and an electrical field strength of 1 V/cm a voltage difference as high as 5000 kV would result between entry and exit, which in case of incoming surge would be still increased. However the larger the voltage difference between two adjacent parts the higher the risk of flashover. Further, lightning surges frequently induces short circuit and there is a need for a safe and reliable protection against such occurrences.

Consequently, there is a need for a fault current limiter having a high breakthrough strength, which can withstand high overloading and safely protects an electrical application against high voltage peaks.

In particular, there is a need for such a fault current limiter which can be safely operated at high to very high voltages.

According to the present invention a high-temperature superconductor (hts) fault current limiter element suitable for a fault current limiter is provided comprising at least one coated conductor of long length and a mandrel tube wherein the at least one coated conductor is helically wound around the mandrel tube in longitudinal direction of the mandrel tube.

In particular, the hts fault current limiter element of the present invention is suitable and designed for use in a stand-alone fault current limiter unit.

Further, the present invention relates to a high-temperature superconductor fault current limiter comprising at least one high-temperature superconductor fault current limiter element according to the present invention.

Preferably, the high-temperature superconductor fault current limiter comprises at least two high-temperature superconductor fault current limiter elements of the present invention which are connected electrically in parallel and/or in series.

In the design of the present hts fault current limiter element current entry is at one end of the mandrel tube and current exit at the opposite end. Consequently, entry and exit are separated from each other by the whole length extension of the mandrel tube. Further, voltage difference between adjacent windings of the coated conductor helically wound onto the mandrel tube, is only small. Thus, a design of high breakthrough strength is obtained, which can withstand high overloadings and is able to safely protect a power application operated at high to very high voltages in fault event.

Moreover the design of the present hts fault current limiter element allows a high degree of standardization and provides modular configuration of a fault current limiter.

The hts fault current limiter of the present invention is a distinct unit which is connected electrically in series with an electrical network for protecting the electrical network against short circuit occurrences.

In particular, the its fault current limiter of the present invention is designed and suitable as a stand-alone fault current limiter.

Due to the modular standardized design of hts fault current limiter elements the hts fault current limiter unit of the present invention can be easily adapted to the requirements of the power application to which it is connected, and can be scaled up or down according to need by varying the number of hts fault current elements. The modular and standardized design of the hts fault current limiter elements of the present invention allow a compact and space saving layout of the fault current limiter unit of the present invention.

Coated conductors and their production processes are well known in the art and are broadly described in the relevant literature as referred to, for example, above.

Coated conductors have a tape-shape of long length, wherein the longitudinal extension significantly exceeds the width or diameter. Generally, they are composed of a substrate, preferably made of a metal which preferably is biaxially textured, an active layer of high-temperature superconductor material and a varying number of buffer layers between the substrate and the superconductor layer.

For example, in a typical coated conductor the substrate can be a flat tape of long length with plane upper and lower surface. A typical width of such a coated conductor tape is from a few millimeters to a few centimeters. According to need the width can be also outside this range.

The coated conductor tape can have an essentially rectangular or essentially round cross-sectional shape. "Essentially rectangular" or "essentially round" means that the cross-sectional shape may deviate from an ideal rectangular or round shape, for example trapezoid or oval.

The substrate can be coated on one side only or on both sides.

Further, in case of an essentially round coated conductor, typically the layers and substrate are coaxially arranged.

Though not restricted thereto currently the rare earth barium cuprate type superconductors of the formula $ReBa_2Cu_3O_{7-x}$ are conventionally used in the production of coated conductors. Re means at least one rare earth element, particularly, Y or a combination of two or more of the elements Y, La, Lu, Sc, Sm, Nd or Yb, and x represents the relative oxygen content in the range appropriate for the particular superconductor material to have superconducting property.

A particular member thereof is that one known by the reference YBCO-123 wherein the numerical combination 123 stands for the stoichiometric ratio of the elements Y, Ba and Cu.

It is also possible to use other hts materials, for example as referred to initially.

Processes for a production of such coated conductor tapes are well-known in the art and are disclosed, for example, in EP 2 012 373 A1, EP 1 892 319 A1, EP 1 655 788 B1, EP 2 012 373 A1, and EP 09 305 754.5 which are incorporated herein by reference.

The mandrel tube, typically, has a cylindrical shape, preferably with round, oval or polygonal cross-section. The mandrel tube can be a solid body or hollow body. Preferably the mandrel tube is a hollow body which allows cooling medium to be pathed through the channel present in the mandrel tube.

Mandrel tubes suitable for the present invention can be advantageously obtained by well-known injection molding techniques.

The mandrel tube is made of an electrically insulating material such as plastic or fiber glass or of a material of only poor electrical conductivity, for example of stainless steel. Further, preferably the mandrel tube is a rigid component of only low flexibility.

The coated conductor tape is wound helically around the mandrel tube in longitudinal direction from one end portion of the mandrel tube to the opposite end portion.

To be suitable for a compact fault current limiter unit the length of coated conductor tape should exceed the height of the mandrel tube by a significant factor, which means that the length of lay should be only small.

The term "length of lay" means the distance required by one single coated conductor tape to be turned 360° C.

It is also possible to wind two or more coated conductor taps helically in parallel onto the mandrel tube.

In this case the individual coated conductor tapes can be connected electrically in parallel.

The diameter of the mandrel tube should be sufficiently large to allow bending radii at which the coated conductor tapes are not mechanically damaged. Suitable bending radii are typically in the range of 20 mm to 50 mm.

A typical mandrel tube of round cross-section suitable for the present invention can have an overall diameter of about 10 cm to about 50 cm and a length of 50 cm to 150 cm, preferably 60 cm to 120 cm. For example, a typical number of windings per layer of conductor tapes can be 40 to 70 windings per meter of the mandrel tube.

In the following some concrete values are given for a current limiter element suitable for the present invention for a better understanding but without being limited thereto.
Mandrel Tube:
 diameter: 10 cm
 length: 110 cm
Coated Conductor Tape:
 width: mm
 nominal current: 100 A (77 K)
first embodiment: 1 tape having a length of 50 m
second embodiment: 10 tapes each having a length of 5 meter In the first embodiment the nominal current of the fault current limiter element is 100 A at a voltage of 5000 V.

In the second embodiment the nominal current is about 1000 A with a voltage of about 500 V.

A plurality of such modular current limiter elements can be used to construct a current limiter device of modular design. By means of a parallel connection of a number n of such elements with nominal current i and nominal voltage u, a current limiter device for a specific nominal current n·i, and by series connection of a number m of such elements for nominal voltage m·u can be obtained.

That is, using the hts fault current limiter elements of the present invention provides a high degree of freedom for the construction of a current limiter device suitable for save protection of power networks of different requirements with respect to nominal current and nominal voltage.

BRIEF DESCRIPTION OF THE DRAWINGS

The present invention will be illustrated in more detail by reference to the accompanying drawings in which:

FIG. 3 is a cut along line A-A' of the embodiment shown in FIG. 2;

FIG. 4 is a cut along line B-B' of the embodiment shown in FIG. 2;

FIG. 6a shows a plurality of high-temperature superconductor fault current limiter elements according to FIG. 2 within a fault current limiter;

FIG. 6b shows a further embodiment of a high-temperature superconductor fault current limiter element of the present invention;

DETAILED DESCRIPTION

Figure 1:
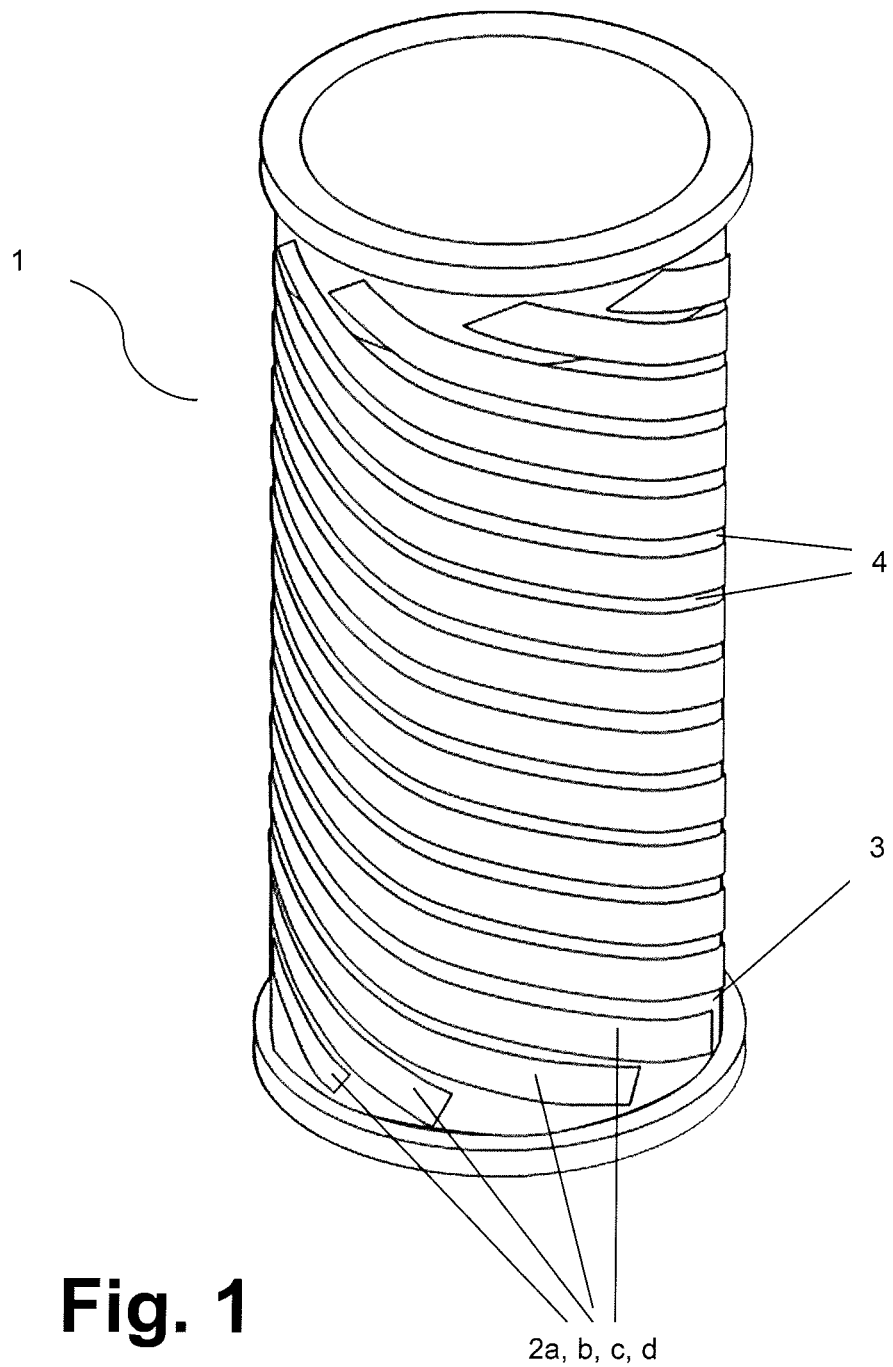
FIG. 1 shows a first embodiment of a high-temperature superconductor fault current limiter element of the present invention.

In the embodiment of the high-temperature superconductor (hts) fault current limiter element 1 shown in FIG. 1 four coated conductor tapes 2a, b, c, d are helically wound in parallel onto a mandrel tube 3 to form a first innermost layer. In this design within the coated conductor tapes 2a, b, c, d voltage increases along the length of the coil configuration. Consequently, there is only a small voltage difference between adjacent tapes 2a, b, c, d.

The space 4 between two adjacent tapes or two adjacent windings should be sufficiently broad in order to avoid flashover.

However, since voltage difference between two adjacent tapes is only small, the design of the present invention has a high breakthrough strength. Thus, partial discharge and flashover etc. is prevented even in case of high voltage application. Further, due to the high breakthrough strength the space between adjacent tapes or adjacent windings can be kept small without the risk of flashover, allowing a high number of tapes or a tape of long length to be wound on an individual mandrel tube 3 which, in turn, contribute to a compact and space saving design of the hts fault current limiter element 1.

For the hts fault current limiter elements 1 of the present invention conventional coated conductor tapes can be used which are well-known in the art and as referred to above.

In the embodiment of FIG. 1 tapes of long length are used with plane upper and lower surfaces.

The mandrel tube 3 used in this embodiment is a hollow cylinder body with round cross-section.

The length of lay is not particularly restricted.

In view of a compact design the length of lay (pitch) should be as small as possible for allowing to wind-up a long length of coated conductor tape onto a given length of mandrel tube 3.

The tapes 2a, b, c, d can be fixed onto the surface of the mandrel tube 3 by solder or similar fixing means known in the art of preparation of coated conductors.

According to a preferred embodiment a guidance groove (not shown in FIG. 1) can be provided within the surface of the mandrel tube 3 having the thread profile of the desired tape winding for accommodating the coated conductor tape.

In case of two or more parallel wound coated conductor tapes 2 an equal number of parallel guidance grooves may be provided. The provision of a guidance groove has the advantage that adjacent windings are kept spaced from each other thereby excluding any contact between adjacent windings or tapes of different voltage. This makes possible use of naked not insulated conductors.

Further, no particular mechanical fixation of the winding is necessary within the guidance groove which enhances mechanical stability in case of fault.

In case of fault the coated conductor winding heats up in very short time from the operation temperature, for example 77K (the temperature of liquid nitrogen) to about 200 K to 400 K. Due to this heating up the coated conductor tape thermally expands to about 0.3% of its length. Since the coated conductor tape is not particularly fixed within the guidance groove thermal expansion is easily possible and the coated conductor tape remains safely guided.

It is also possible to wind two or more layers of coated conductor tapes coaxially onto one mandrel tube 3. In order to reduce inductivity of such a design, preferably, the direction of rotation of adjacent layers is counterclockwise.

Figure 2:
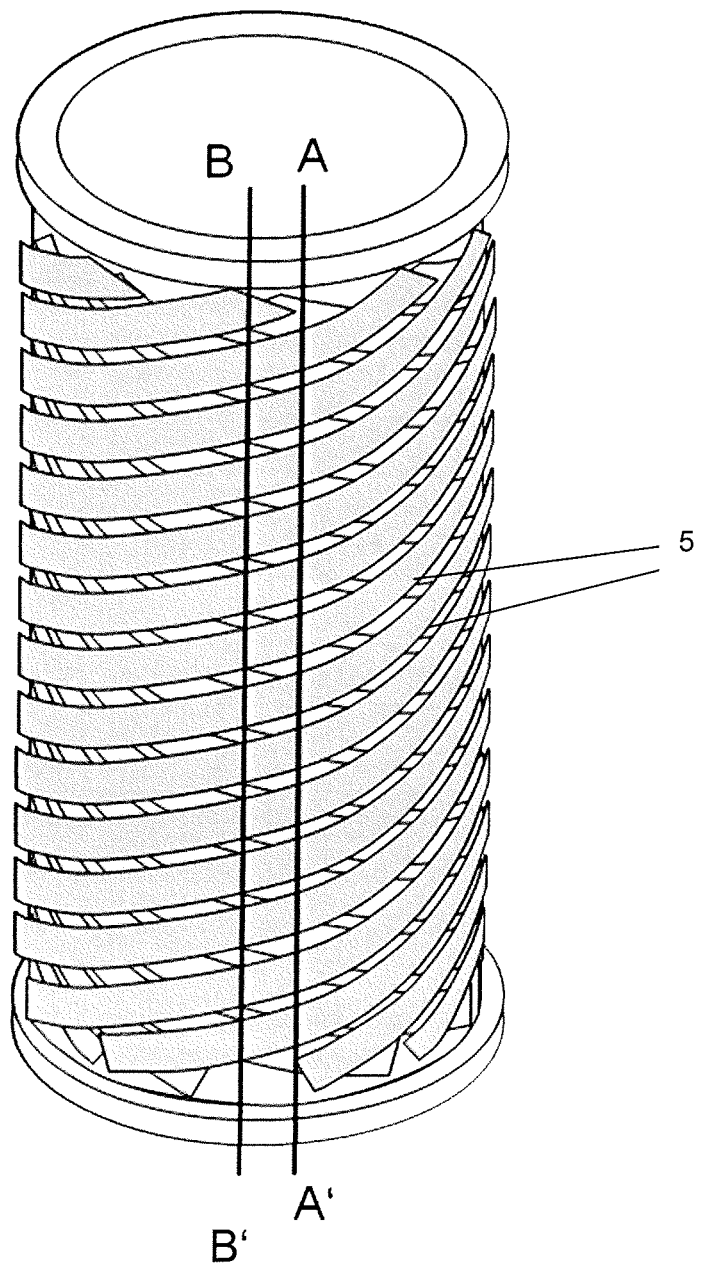
FIG. 2 shows a second embodiment of a high-temperature superconductor fault current limiter element of the present invention.

An embodiment with a second layer 5 of coated conductor tapes with counterclockwise winding is shown in FIG. 2.

Preferably the second layer 5 is composed of the same number of coated conducted tapes as used for the first innermost layer.

Preferably spacers (not shown) are provided for spacing the individual layers from each other. The spacers can be integrated onto the surface of the mandrel tube 3. For the spacers any material of low or only poor electrical conductivity can be used, for example a material as used for the mandrel tube 3.

A further advantage of the provision of spacers is that in the voidage provided by the spacers between the individual layers cooling medium can be circulated thereby facilitating cooling and heat dissipation from the coated conductor tapes.

A preferred design of an embodiment of the present invention with two or more layers of coated conductor tapes is shown in FIGS. 3 and 4 each being a cut along lines A-A' and B-B', respectively, shown in FIG. 2.

In this design within the surface of the mandrel tube 3 two different guidance grooves are provided having different depth.

The first layer of coated conductor tape(s) is provided onto the bottom of the deeper guidance groove. The second guidance groove intersects in counterclockwise direction the bars remaining between adjacent windings of the first guidance groove. Consequently, the coated conductor tape(s) of the second layer are rested only onto these bars. In this embodiment the thickness of the coated conductor tape(s) of the lower layer should be less than the depth of the respective guidance groove for providing a space between upper surface of coated conductor tape(s) (2) of the lower layer and the lower surface of coated conductor tape(s) of the upper layer 5. This is a particular advantage of this design since the cooling medium can circulate around the upper coated conductor tape(s) from both sides. Further, if in fault event gas bubbles of nitrogen are generated these gas bubbles can easily escape via the gaps present between the coated conductor tape(s) of the upper layer 5.

Optionally, in case of hollow mandrel bodies openings 8 such as through-holes, can be provided within the wall of the mandrel tube 3 for improving cooling of the innermost first layer.

As shown in FIG. 4 such openings 8 can be provided within the bottom of the first guidance groove along the pathway of the first layer of coated conductor tape(s).

Referring to FIG. 3 electrical contacts 9 are provided at both ends of the mandrel tube 3 for electrically connecting the hts fault current limiter element 1 with the electrical network or similar electrical application to be protected by the fault current limiter.

The electrical contacts 9 are made of a material of good electrical conductivity, for example a metal such as copper, brass, silver, silver alloy or similar material.

The coated conductor tapes of each layer can be fixed at both ends of the mandrel tube 3 by soldering, said solder 10 simultaneously can serve to electrically connect the coated conductor tapes with the electrical contact 9. As a solder 10 any solder can be used as is well known in the production of coated conductor tapes.

The electrical contact 9 has a shape fitting to the shape of the mandrel tube 3.

In the embodiment shown in FIGS. 3 and 4, wherein the hts fault current limiter element 1 has a cylindrical shape of round cross-section, also the electrical contact 9 has a round or annular shape.

In the embodiment shown in FIGS. 3 and 4 the outer surface portion of the electrical contact 9 is stepped, wherein the steps formed in the outer surface of the electrical contact 9 serve to support the ends of the coated conductor tapes of each layer and the end portions of the mandrel tube 3. In the embodiment shown in FIGS. 3 and 4 the uppermost step has the smallest diameter or protrusion and the lower-most step the largest diameter or protrusion, that is, the diameter or protrusion of the steps increases towards each end of the hts fault current limiter element 1.

For a strong connection of the electrical contact 9 with the mandrel tube 3 the and portion of the mandrel tube 3 can overlap with the respective end portion of the electrical contact 9. In this case, the ends of the guidance grooves can overlap with the respective end portion of electrical contact 9. For allowing sufficient contact with the cooling medium openings 8 can be provided extending through the wall of the mandrel tube 3 and through the wall of the electrical contact as shown in FIG. 4.

In some cases an additional spacer can be provided between the coated conductor tapes of the individual layers. For example, as indicated in FIG. 4, as a spacer 11 a web or nonwoven fabric of insulating material can be provided onto the upper surface of the coated conductor tapes of the lower-most layer.

An example of a suitable insulating material is fiberglass or similar.

In some cases each layer can be composed of a stack of coated conductor tapes wherein two or more coated conductor tapes are wound on top of each other. Such an embodiment is indicated in FIG. 5 differing from the embodiment shown in FIGS. 3 and 4 in that the lower-most layer 12 and the second layer 5 are each composed of a stack of coated conductors wherein at least two coated conductor tapes are applied on top of each other.

Such an arrangement can be suitable in applications wherein minimization of recovery time of the hts fault current limiter element 1 is not particularly critical.

The mandrel tube 3 of the present invention, for example with integrated guidance groove(s), can be easily obtained by conventional injection molding techniques.

The hts fault current limiter element of the present invention allows standardized design and is particularly suitable for modular configuration of hts fault current limiters. According to need a suitable number of hts fault current limiter elements 1 of the present invention can be assembled within a fault current limiter in series and/or in parallel for providing a fault current limiter unit adapted to the current and voltage requirements of the respective electrical application.

An example for an arrangement of hts fault current limiter elements 1 which are connected electrically in parallel, is shown in FIG. 6a. Here 7 hts current limiter elements 1 are arranged in a space saving manner within a common housing for the production of an one-phase fault current limiter. The hts fault current limiter elements 1 have a standardized design which allows easy adaptation to the current and voltages requirements of the specific electrical application.

In FIG. 6b a further embodiment of the hts fault current limiter element 1 of the present invention is illustrated. Here a second hts fault current limiter element is co-axially positioned within the hollow interior of an outer hts fault current limiter element 1.

The switching voltage of a hts fault current limiter element of the present invention can be adjusted by the lay length and/or number of parallel wound coated conductor tapes. Thus, in case of hts fault current limiter elements of different diameter such as is the case in the coaxial arrangement shown in FIG. 6b the switching voltage of the inner element 13 can be adapted to correspond to the switching voltage of the outer element 1 by suitable selection of lay length and/or number of parallel wound coated conductor tapes.

In some cases more than 2 hts fault current limiter elements 1, 13 can be coaxially arranged one into the other resulting in particularly compact design.

Figure 7:
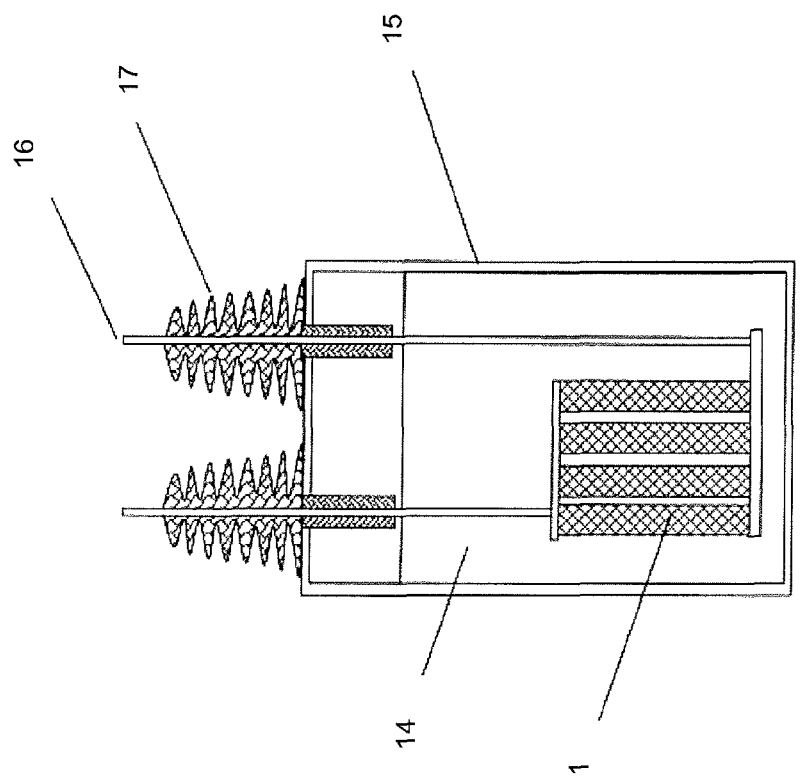
FIG. 7 shows a design of a fault current limiter with the high-temperature superconductor fault current limiter elements of the present invention.
Figure 8:
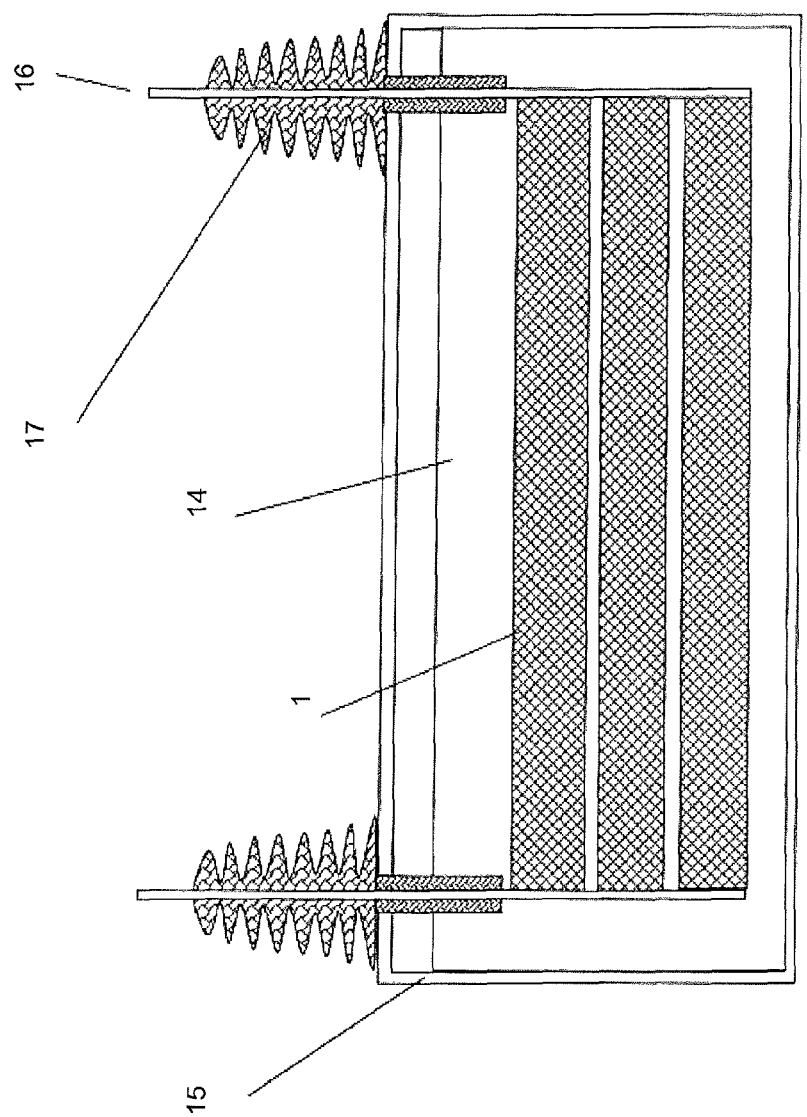
FIG. 8 shows a further design of a fault current limiter with the high-temperature superconductor fault current limiter elements of the present invention.

Two different designs of an one-phase hts fault current limiter of the present invention are illustrated in FIGS. 7 and 8. In the designs shown in FIGS. 7 and 8 the hts fault current limiter elements 1 are mounted within the cryostat 15 in vertical and, respectively, horizontal position.

In the current limiter shown in FIG. 7 the hts fault current limiter elements 1 are positioned vertically within a bath of cooling medium 14 in the cryostat 15. Further, electrical contact 16 is indicated for current supply as well as insulator 17 for leading the current contact into and, respectively, out of the cryostat 15.

In FIG. 8 a horizontal arrangement of the hts fault current limiter elements 1 in a fault current limiter is shown.

Due to the open construction of the hts fault current limiter elements 1 of the present invention both designs, with horizontal and, respectively, vertical position, are possible. In particular, the design shown in FIG. 8 is preferably applied in fault current limiters for high and very high voltage applications of 100 kV and more, wherein spatial separation of the potentials is particularly important.

In electrical applications with more than one phase current, a fault current limiter unit according to the present invention for each phase can be provided.

REFERENCE LIST

1 hts fault current limiter element
2 coated conductor tape
3 mandrel tube
4 space between 2 adjacent coated conductor windings
5 second layer of coated conductor tapes
6 bar
7 gap
8 opening
9 electrical contact
10 solder
11 spacer
12 lowermost layer
13 co-axially arranged further element
14 cooling bath
15 cryostat
16 current conduct
17 insulator

The invention claimed is:

1. High-temperature superconductor fault current limiter element comprising:
    at least one coated conductor tape; and
    a mandrel tube,
    wherein the at least one coated conductor tape is wound helically onto the mandrel tube in direction of the longitudinal extension of the mandrel tube to form a first layer,
    wherein current entry is at one end of the mandrel tube and current exit at the opposite end, and
    wherein the high-temperature superconductor fault current limiter element is suitable for the construction of a high-temperature superconductor fault current limiter unit.

2. High-temperature superconductor fault current limiter element according to claim 1, wherein two or more coated conductor tapes are wound helically and in parallel around the mandrel tube.

3. High-temperature superconductor fault current limiter element according to claim 1, wherein a guidance groove having the thread profile of the winding of the at least one coated conductor tape is provided within the outer surface of the mandrel tube for accommodating the at least one coated conductor tape.

4. High-temperature superconductor fault current limiter element according to claim 1, wherein one or more further layers composed of at least one coated conductor tape is wound helically above the first layer of at least one coated conductor tape.

5. High-temperature superconductor fault current limiter element according to claim 4, wherein the winding direction of adjacent layers is counter-clockwise.

6. High-temperature superconductor fault current limiter element according to claim 3,
    wherein a first guidance groove having the thread profile of the winding of the at least one coated conductor tape is provided within the outer surface of the mandrel tube for accommodating the at least one coated conductor tape,
    wherein a further guidance groove is provided within the outer surface of the mandrel tube,
    wherein the winding direction of said further guidance groove is counter clockwise to the winding direction of the first winding groove,
    wherein said further guidance groove is located above the first guidance groove,
    wherein the further guidance groove intersects the separation bars of the first guiding groove, and
    wherein the first guidance groove is deeper than the upper further guidance groove.

7. High-temperature superconductor fault current limiter element according to claim 1, wherein the mandrel tube is a hollow cylindrical body.

8. High-temperature superconductor fault current limiter element according to claim 7, wherein in the bottom of a first guidance groove along the path of the at least one coated conductor tape of the first layer openings are provided.

9. High-temperature fault current limiter element according to claim 1, wherein at each end of the mandrel tube electrical contacts are provided, wherein the electrical contacts have a stepped outer surface with the step with smallest protrusion being directed towards the mandrel tube and the step with the highest protrusion being directed away from the end of the mandrel tube.

10. High-temperature fault current limiter element according to claim 1, wherein at least one further high-temperature superconductor fault current limiter element is coaxially arranged within the first high-temperature superconductor fault current limiter element.

11. High-temperature fault current limiter element according to claim 1, wherein within a layer a stack of coated conductor tapes is used, wherein at least two coated conductor tapes are put on top of each other.

12. Use of a high-temperature superconductor fault current limiter element according to claim 1 in the construction of a fault current limiter unit,
wherein at least one high-temperature superconductor fault current limiter element is mounted within a cryostat.

13. High-temperature superconductor fault current limiter unit comprising at least one high-temperature superconductor fault current limiter element according to claim 1, comprising at least one coated conductor tape and a mandrel tube, wherein the at least one coated conductor tape is wound helically onto the mandrel tube in direction of the longitudinal extension of the mandrel tube to form a first layer, and wherein current entry is at one end of the mandrel tube and current exit at the opposite end,
wherein the high temperature superconductor fault current limiter unit is a standalone fault current limiter unit.

14. High temperature superconductor fault current unit according to claim 13,
wherein at least one temperature superconductor fault current limited element, a first guidance groove having the thread profile of the winding of the at least one coated conductor tape is provided within the outer surface of the mandrel tube for accommodating the at least one coated conductor tape.

15. High temperature conductor fault current limiter unit according to claim 14,
wherein a further guidance groove is provided within the outer surface of the mandrel tube of the at least one high temperature superconductor fault current limiter element,
wherein the winding direction of said further guidance groove is counter clockwise to the winding direction of the first winding groove,
wherein said further guidance groove is located above said first guidance groove,
wherein said further guidance groove intersects the separation bars of said first guidance groove, and
wherein said first guidance groove is deeper than the upper further guidance groove.

* * * * *

UNITED STATES PATENT AND TRADEMARK OFFICE
CERTIFICATE OF CORRECTION

PATENT NO.        : 8,582,256 B2
APPLICATION NO.   : 13/330998
DATED             : November 12, 2013
INVENTOR(S)       : Steinmeyer et al.

It is certified that error appears in the above-identified patent and that said Letters Patent is hereby corrected as shown below:

In the Claims

Column 12, Claim 14, Line 3: The word --high-- should be inserted between the words "one" and "temperature"

Signed and Sealed this
Twenty-fourth Day of December, 2013

Margaret A. Focarino
*Commissioner for Patents of the United States Patent and Trademark Office*